United States Patent
Kluth et al.

(10) Patent No.: US 6,902,977 B1
(45) Date of Patent: Jun. 7, 2005

(54) METHOD FOR FORMING POLYSILICON GATE ON HIGH-K DIELECTRIC AND RELATED STRUCTURE

(75) Inventors: George J. Kluth, Campbell, CA (US); Joong S. Jeon, Cupertino, CA (US); Qi Xiang, San Jose, CA (US); Huicai Zhong, Wappinger Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/678,445

(22) Filed: Oct. 3, 2003

(51) Int. Cl.[7] .............................. H01L 21/336
(52) U.S. Cl. ................ 438/261; 438/287; 438/488; 438/591
(58) Field of Search .................. 438/261, 287, 438/488, 591

(56) References Cited

U.S. PATENT DOCUMENTS 6,451,641 B1 * 9/2002 Halliyal et al. ............. 438/200
6,620,713 B2 * 9/2003 Arghavani et al. .......... 438/585

* cited by examiner

Primary Examiner—Thien F Tran
(74) Attorney, Agent, or Firm—Farjami & Farjami LLP

(57) ABSTRACT

According to one exemplary embodiment, a method for forming a field-effect transistor on a substrate comprises a step of forming a high-k dielectric layer over the substrate. The high-k dielectric layer may be, for example, hafnium oxide or zirconium oxide. The method further comprises forming a first polysilicon layer over the high-k dielectric layer, where the first polysilicon layer is formed by utilizing a precursor does not comprise hydrogen. The first polysilicon layer can have a thickness of between approximately 50.0 Angstroms and approximately 200.0 Angstroms, for example. According to this exemplary embodiment, the method can further comprise forming a second polysilicon layer over the first polysilicon layer. The second polysilicon layer may be formed, for example, by utilizing a precursor that comprises hydrogen, where the first polysilicon layer prevents the hydrogen from interacting with the high-k dielectric layer.

12 Claims, 3 Drawing Sheets

METHOD FOR FORMING POLYSILICON GATE ON HIGH-K DIELECTRIC AND RELATED STRUCTURE

TECHNICAL FIELD

The present invention is generally in the field of semiconductor devices. More particularly, the present invention is in the field of fabrication of field effect transistors.

BACKGROUND ART

As field effect transistors ("FET"), such as PFETs and NFETs, are scaled down in size, semiconductor manufactures have utilized gate dielectrics having a high dielectric constant ("high-k") to improve FET performance and reliability. High-k gate dielectrics are desirable in small feature size technologies since conventional gate dielectrics, such as silicon dioxide, are too thin and they result in high tunneling current, as well as other problems, which decrease performance and reliability of FETs. The FET also includes a gate electrode layer, which can be formed over the high-k gate dielectric layer. The gate electrode layer can comprise a conductive material such as doped polysilicon ("poly"), which is often used as a gate electrode material. However, when a poly gate electrode layer is formed over a high-k gate dielectric layer utilizing a conventional process, an undesirable interaction can occur between the poly gate electrode layer and the high-k dielectric layer, which can degrade the performance of the FET.

In a conventional process for fabricating a FET having a high-k gate dielectric and a poly gate electrode, a high-k dielectric, such as hafnium oxide or zirconium oxide, is formed over a channel region of a silicon substrate. Next, a layer of poly is deposited over the high-k dielectric layer typically utilizing a conventional precursor comprising silane ("$SiH_4$"). However, an interaction can occur between the poly layer and the high-k material, such a hafnium oxide or zirconium oxide, which can degrade. the FET by causing high leakage between the poly gate electrode and the channel region of the substrate. According to one theory, the high leakage occurs as a result of hydrogen, which is released from the silane and which undesirably interacts with and reduces hafnium or zirconium in the high-k dielectric layer.

Thus, there is a need in the art for an effective method for forming a polysilicon gate electrode over a high-k dielectric in a FET.

SUMMARY

The present invention is directed to method for forming polysilicon gate on high-k dielectric and related structure. The present invention addresses and resolves the need in the art for an effective method for forming a polysilicon gate electrode over a high-k dielectric in a FET.

According to one exemplary embodiment, a method for forming a field-effect transistor on a substrate comprises a step of forming a high-k dielectric layer over the substrate. The high-k dielectric layer may be, for example, hafnium oxide or zirconium oxide. The method further comprises forming a first polysilicon layer over the high-k dielectric layer, where the first polysilicon layer is formed by utilizing a precursor does not comprise hydrogen. For example, the first polysilicon layer may be formed by utilizing a silicon tetrachloride precursor in an atomic layer deposition process or by utilizing a physical vapor deposition process. The first polysilicon layer can have a thickness of between approximately 50.0 Angstroms and approximately 200.0 Angstroms, for example.

According to this exemplary embodiment, the method may further comprise forming a second polysilicon layer over the first polysilicon layer. The second polysilicon layer may be formed, for example, by utilizing a precursor that comprises hydrogen, where the first polysilicon layer prevents the hydrogen from interacting with the high-k dielectric layer. The first polysilicon layer and the second polysilicon layer can form a gate electrode stack, for example, where the gate electrode stack can have a thickness of between approximately 1000.0 Angstroms and approximately 2000.0 Angstroms. In one embodiment, the invention is a field effect transistor fabricated by utilizing the above-discussed method. Other features and advantages of the present invention will become more readily apparent to those of ordinary skill in the art after reviewing the following detailed description and accompanying drawings.

DETAILED DESCRIPTION OF THE INVENTION

The present invention is directed to method for forming polysilicon gate on high-k dielectric and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
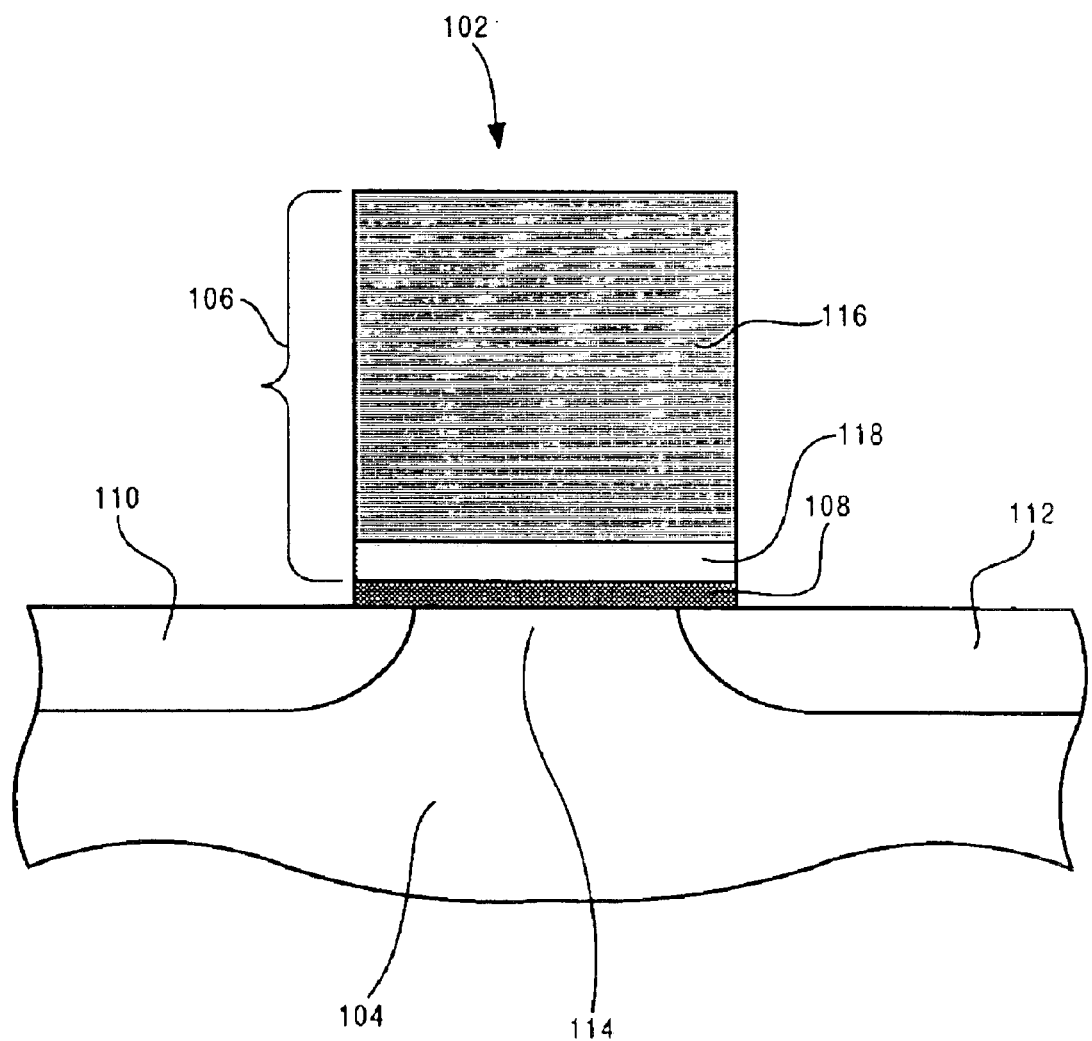
FIG. 1 illustrates a cross-sectional view of a structure including an exemplary field-effect transistor, in accordance with one embodiment of the present invention.

FIG. 1 shows a cross-sectional view of an exemplary structure including an exemplary FET in accordance with one embodiment of the present invention. Structure 100 includes FET 102, which is situated on substrate 104. FET 102 includes gate electrode stack 106, high-k dielectric layer 108, source 110, drain 112, and channel region 114. Gate electrode stack 106 includes poly layer 116 and poly layer 118. In the present embodiment, FET 102 can be an NFET or a PFET. In one embodiment, FET 102 can be a MOSFET, such as an NMOS or PMOS transistor. The present invention can also be applied to a floating gate structure, where the floating gate structure comprises a layer of polysilicon situated over a high-k dielectric layer comprising, for example, hafnium oxide or zirconium oxide.

As shown in FIG. 1, source 110 and drain 112, which are formed in a manner known in the art, are situated in substrate 104 and channel region 114 is situated between source 110 and drain 112. Further shown in FIG. 1, high-k dielectric layer 108 is situated over channel region 114 of substrate 104. High-k dielectric layer 108 can be deposited over substrate 104 utilizing a chemical vapor deposition ("CVD") process or other appropriate processes and can comprise a high-k dielectric such as hafnium oxide or zirconium oxide. By way of example, high-k dielectric layer 108 can have a thickness of between approximately 20.0 Angstroms and approximately 100.0 Angstroms.

Also shown in FIG. 1, poly layer 118 is situated over high-k dielectric layer 108 and can comprise polycrystalline silicon (also referred to as polysilicon). In the present embodiment, poly layer 118 can be formed by depositing a layer of polysilicon over high-k dielectric layer 108 in a deposition process that does not utilize a precursor that comprises hydrogen. For example, poly layer 118 can be formed by depositing a layer of polysilicon utilizing an atomic layer deposition ("ALD") process, which can utilize silicon tetrachloride ("$SiCl_4$") as a precursor. In the ALD process, $SiCl_4$, which provides a source of silicon, is deposited over high-k dielectric layer 108. As a result, an atomic layer of silicon is formed on the surface of high-k dielectric layer 108 and chlorine is released, which can be removed by utilizing water in a manner known in the art. The cycle of depositing $SiCl_4$ and removing chlorine is repeated to form each atomic layer of silicon. As a result, the layer of polysilicon is formed one atomic layer at a time. By way of example, poly layer 118 can have a thickness of between approximately 50.0 Angstroms and approximately 200.0 Angstroms.

In one embodiment, poly layer 118 can be formed by utilizing a physical vapor deposition ("PVD") process to deposit silicon on high-k dielectric layer 108. The PVD process also does not utilize a precursor, such as silane, which comprises hydrogen. Thus, by utilizing a hydrogen-free precursor to form poly layer 118, the present invention provides a poly layer that comprises substantially no hydrogen. In one embodiment, the present invention provides a poly layer that comprises substantially less hydrogen that a conventional process that utilizes silane as a precursor. As a result, the present invention avoids detrimental high leakage that can occur between a poly layer and a channel region when the poly layer is formed over a high-k dielectric, such as hafnium oxide or zirconium oxide, by utilizing a convention precursor chemistry comprising silane.

Further shown in FIG. 1, poly layer 116 is situated over poly layer 118 and can comprise polysilicon. However, unlike poly layer 118, poly layer 116 can be formed in a conventional process, such as a CVD process or other appropriate processes, which can utilize silane as a precursor. By way of example, the thickness of poly layer 116 can be determined such that the combined thickness of poly layer 116 and poly layer 118, i.e. the thickness of gate electrode stack 106, is between approximately 1000.0 Angstroms and approximately 2000.0 Angstroms. Since poly layer 116 can be formed utilizing silane as a precursor, poly layer 116 can comprise hydrogen. However, poly layer 118 acts as a blocking layer to prevent hydrogen in poly layer 116 from detrimentally reacting with high-k dielectric layer 108.

Figure 2:
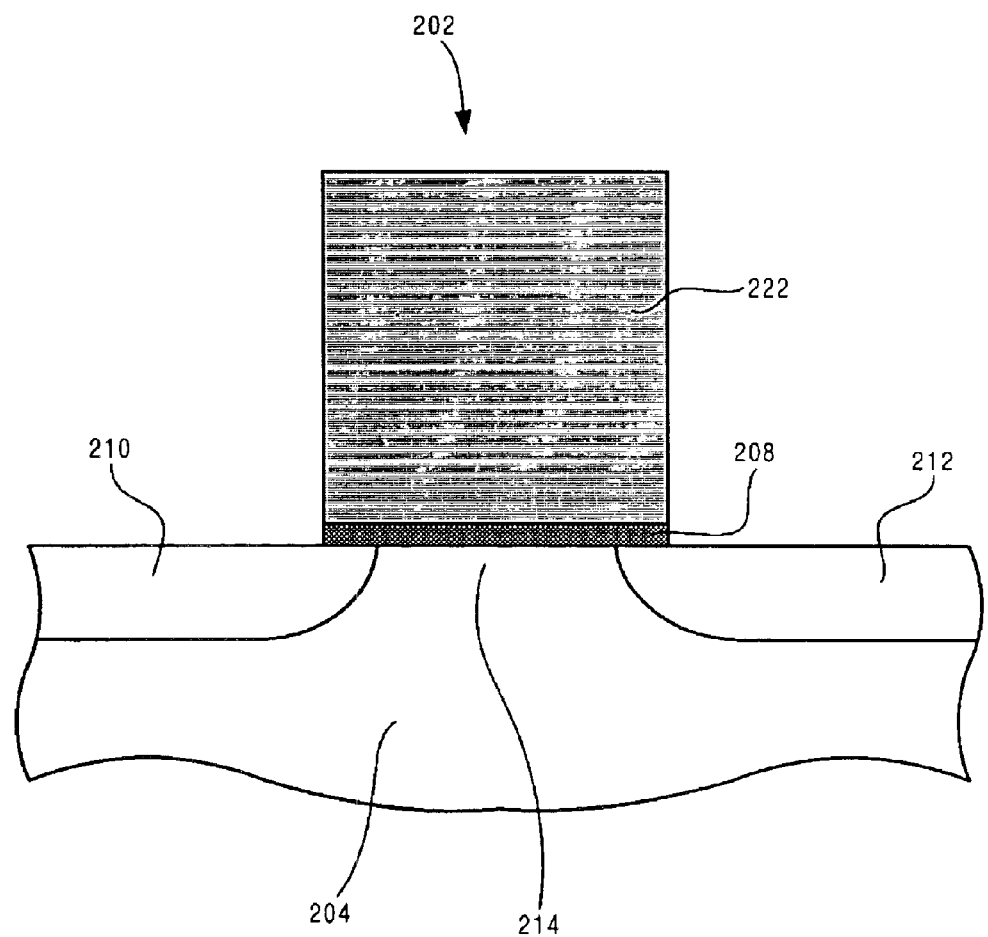
FIG. 2 illustrates a cross-sectional view of a structure including an exemplary field-effect transistor, in accordance with one embodiment of the present invention.

FIG. 2 shows a cross-sectional view of an exemplary structure including an exemplary FFT in accordance with one embodiment of the present invention. Structure 200 includes FET 202, which is situated on substrate 204. FET 202 includes gate electrode layer 222, high-k dielectric layer 208, source 210, drain 212, and channel region 214. Similar to FET 102, FET 202 can be an NFET or a PFET. In one embodiment, FET 202 can be a MOSFET, such as an NMOS or PMOS transistor. In structure 200 in FIG. 2, substrate 204, high-k dielectric layer 208, source 210, drain 212, and channel region 214 correspond, respectively, to substrate 104, high-k dielectric layer 108, source 110, drain 112, and channel region 114 in structure 100.

As shown in FIG. 2, source 210 and drain 212 are situated in substrate 204 and channel region 214 is situated between source 210 and drain 212. Further shown in FIG. 2, high-k dielectric layer 208 is situated over channel region 214 of substrate 204. High-k dielectric layer 208 is substantially similar in composition, thickness, and formation to high-k dielectric layer 108 in FIG. 1. Also shown in FIG. 2, gate electrode layer 222 is situated over high-k dielectric layer 208 and can comprise polysilicon. Similar to poly layer 118 in FIG. 1, gate electrode layer 222 can be formed by depositing a layer of polysilicon over high-k dielectric layer 208 in a deposition process that does not utilize a precursor, such as silane, that comprises hydrogen. For example, gate electrode layer 222 can be formed by depositing a layer of polysilicon utilizing an ALD process as discussed above, which can utilize hydrogen-free $SiCl_4$ as a precursor. In one embodiment, gate electrode layer 222 can be formed in a PVD process that also does not utilize silane or other precursor that comprises hydrogen. By way of example, gate electrode layer 222 can have a thickness of between approximately 1000.0 Angstroms and approximately 2000.0 Angstroms.

Thus, by utilizing a hydrogen-free precursor to form gate electrode layer 222, the present invention provides a gate electrode layer that comprises polysilicon and also comprises substantially no hydrogen. As a result, the embodiment of the present invention in FIG. 2 avoids detrimental high leakage that can occur between a poly layer and a channel region when the poly layer is formed over a high-k dielectric, such as hafnium oxide or zirconium oxide, by utilizing a conventional precursor chemistry comprising silane.

Figure 3:
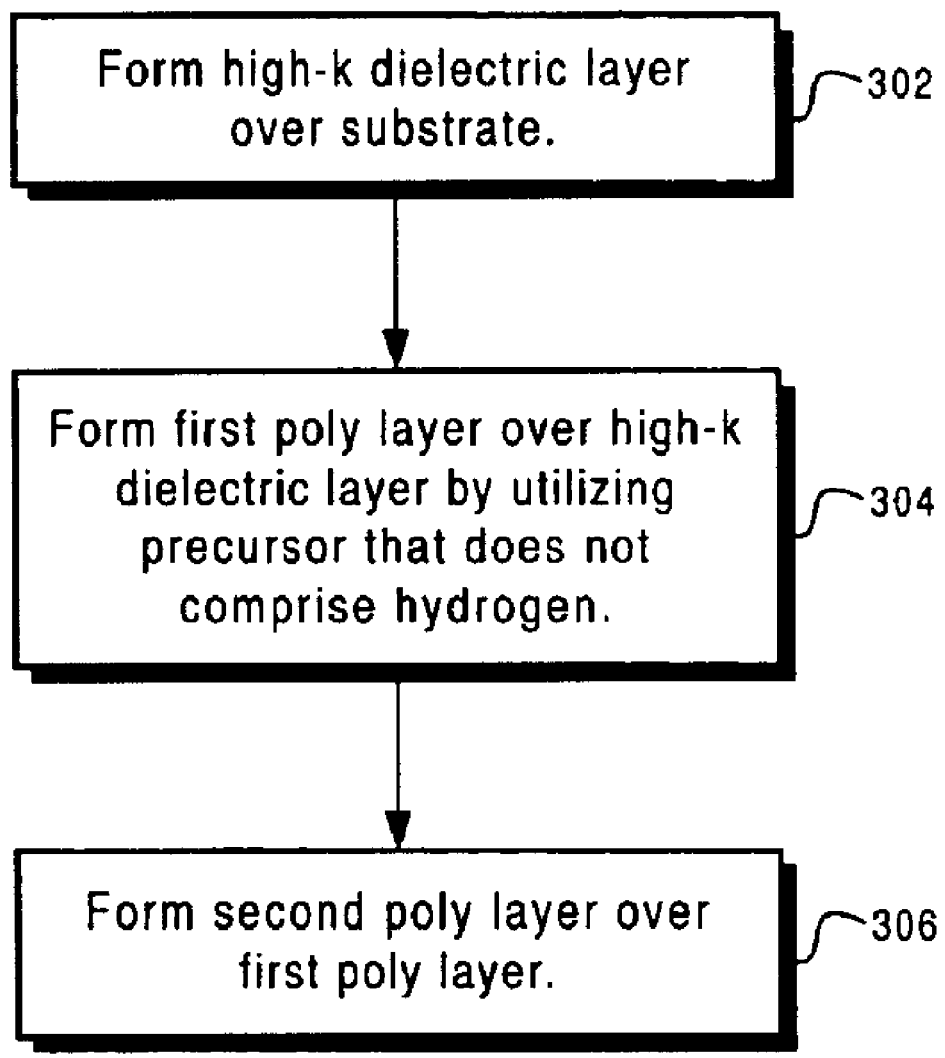
FIG. 3 is a flowchart corresponding to exemplary method steps according to one embodiment of the present invention.

FIG. 3 shows a flowchart illustrating an exemplary method according to one embodiment of the present invention. Certain details and features have been left out of flowchart 300 that are apparent to a person of ordinary skill in the art. For example, a step may consist of one or more substeps or may involve specialized equipment or materials, as known in the art. At step 302, a high-k dielectric layer is formed over a substrate. For example, high-k dielectric layer 108 can be formed by utilizing a CVD process to deposit a high-k dielectric, such as hafnium oxide or zirconium oxide, over substrate 104. At step 304, a first poly layer is formed over a high-k dielectric layer by utilizing a precursor that does not comprise hydrogen. For example, poly layer 118 can be formed over high-k dielectric layer 108 by depositing a layer of polysilicon in an ALD process utilizing $SiCl_4$ as a precursor, which does not comprise hydrogen. In one embodiment, poly layer 118 can be formed over high-k dielectric layer 108 by depositing a layer of polysilicon in a PVD process. At step 306, a second poly layer is formed over the first poly layer. For example, poly layer 116 can be formed by utilizing a deposition process that comprises a convention precursor, such as silane, to deposit a layer of polysilicon over poly layer 118. Thus, although poly layer 116 can comprise hydrogen, poly layer 118 prevents the hydrogen in poly layer 116 from detrimentally interacting with high-k dielectric layer 108.

Thus, by utilizing a precursor that does not comprise hydrogen to form a polysilicon gate electrode layer, the present invention achieves a polysilicon gate electrode layer that comprises substantially no hydrogen. As a result, the present invention advantageously prevents FET performance degradation that can occur when a polysilicon gate electrode layer is formed utilizing silane as a precursor and is situated above a high-k dielectric layer comprising, for example, hafnium oxide or zirconium oxide.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

The, method for forming polysilicon gate on high-k dielectric and related structure have been described.

What is claimed is:

1. A method of forming a field-effect transistor on a substrate, said method comprising steps of:

forming a high-k dielectric layer over said substrate;

forming a first polysilicon layer over said high-k dielectric layer, said first polysilicon layer being formed by utilizing a precursor that does not comprise hydrogen;

forming a second polysilicon layer over said first polysilicon layer.

2. The method of claim 1 wherein said step of forming said first polysilicon layer over said high-k dielectric layer comprises utilizing a silicon tetrachloride precursor in an atomic layer deposition process.

3. The method of claim 1 wherein said second polysilicon layer is formed by utilizing a precursor that comprises said hydrogen, said first polysilicon layer preventing said hydrogen from interacting with said high-k dielectric layer.

4. The method of claim 1 wherein said first polysilicon layer has a thickness of between approximately 50.0 Angstroms and approximately 200.0 Angstroms.

5. The method of claim 1 wherein said first polysilicon layer and said second polysilicon layer form a gate electrode stack, said gate electrode stack having a thickness of between approximately 1000.0 Angstroms and approximately 2000.0 Angstroms.

6. The method of claim 1 wherein said high-k dielectric layer is selected from the group consisting of hafnium oxide and zirconium oxide.

7. The method of claim 1 wherein said step of forming said first polysilicon layer over said high-k dielectric layer comprises utilizing a physical vapor deposition process.

8. A method of forming a field-effect transistor on a substrate, said method comprising steps of:

forming a high-k dielectric layer over said substrate;

forming a gate electrode layer over said high-k dielectric layer, said gate electrode layer comprising a second layer of polysilicon situated over a first layer of polysilicon, said first layer of polysilicon in said gate electrode layer being formed by utilizing a precursor that does not comprise hydrogen.

9. The method of claim 8 wherein said step of forming said gate electrode layer over said high-k dielectric layer comprises utilizing a silicon tetrachloride precursor in an atomic layer deposition process.

10. The method of claim 8 said step of forming said gate electrode layer over said high-k dielectric layer comprises utilizing a physical vapor deposition process.

11. The method of claim 8 wherein said high-k dielectric layer is selected from the group consisting of hafnium oxide and zirconium oxide.

12. The method of claim 8 wherein said gate electrode layer has a thickness of between approximately 1000.0 Angstroms and approximately 2000.0 Angstroms.

* * * * *